United States Patent [19]
Tai

[11] Patent Number: 5,724,283
[45] Date of Patent: Mar. 3, 1998

[54] DATA STORAGE ELEMENT AND METHOD FOR RESTORING DATA

[75] Inventor: Jy-Der D. Tai, Phoenix, Ariz.

[73] Assignee: Motorola, Inc., Schaumburg, Ill.

[21] Appl. No.: 689,578

[22] Filed: Aug. 13, 1996

Related U.S. Application Data

[63] Continuation of Ser. No. 490,368, Jun. 14, 1996, abandoned.

[51] Int. Cl.$^6$ ............................................... G11C 11/22
[52] U.S. Cl. ............................................... 365/145; 365/149
[58] Field of Search ........................... 365/145, 149, 365/65

[56] References Cited

U.S. PATENT DOCUMENTS

| | | | |
|---|---|---|---|
| 4,419,743 | 12/1983 | Taguchi | 365/149 |
| 4,888,733 | 12/1989 | Mobley | 365/145 |
| 4,893,272 | 1/1990 | Eaton, Jr. et al. | 365/145 |
| 5,031,143 | 7/1991 | Jaffe | 365/145 |
| 5,289,421 | 2/1994 | Lee | 365/149 |
| 5,309,391 | 5/1994 | Papaliolios | 365/145 |
| 5,414,653 | 5/1995 | Onishi et al. | 365/145 |

FOREIGN PATENT DOCUMENTS

| | | |
|---|---|---|
| 0293798 | 12/1988 | European Pat. Off. . |
| 0615247 | 9/1994 | European Pat. Off. . |

OTHER PUBLICATIONS

Joseph T. Evans and Richard Womack, "An Experimental 512–bit Nonvolatile Memory with Ferroelectric Storage Cell", The Journal of Solid–State Circuits, vol. 23, No. 5, Oct. 1988, pp. 233–237.

Ramtron, FRAM Memory Products, 1994, pp. 1–65–1–67.

*Primary Examiner*—A. Zarabian
*Attorney, Agent, or Firm*—Rennie William Dover; Ziye Zhou

[57] ABSTRACT

A data storage element (10) comprises a switch (11) and a ferroelectric capacitor (12). The switch (11) has a control terminal connected to a word line (13), a first current conducting terminal coupled to a bit line (16) via the ferroelectric capacitor (12), and a second current conducting terminal connected to a plate line (14). The data storage element (10) fully restores data in the ferroelectric capacitor (12) after a reading operation without consuming extra power to boost the word line (13) voltage.

17 Claims, 1 Drawing Sheet

DATA STORAGE ELEMENT AND METHOD FOR RESTORING DATA

This application is a continuation of prior application Ser. No. 08/490,368, filed Jun. 14, 1996 abandoned.

BACKGROUND OF THE INVENTION

The present invention relates, in general, to data storage elements, and more particularly, to nonvolatile data storage elements.

The packing density and the power consumption of nonvolatile data storage elements are becoming increasingly important issues in low power applications including portable computers and personal communication. Typically, a ferroelectric nonvolatile data storage element includes a capacitor with polarization retention for storing information and a switch, such as a bi-directional pass gate, for accessing the capacitor. When a bi-directional pass gate, e.g., a complementary metal oxide semiconductor (CMOS) pass gate, consisting of an n-channel insulated gate field effect transistor (IGFET) and a p-channel IGFET, is used as a switch to access a ferroelectric memory capacitor, data can be stored and restored without degradation because there is no voltage drop across the pass gate. However, in high density ferroelectric random access memory (FERAM) designs, a pass gate having a single transistor is preferable because it uses less area than a CMOS pass gate.

As those skilled in the art are aware, a high level voltage transmitted through a single n-channel IGFET pass gate is degraded by one transistor threshold voltage, which results in a voltage degradation when storing and restoring a logical "one" in a FERAM cell. Similarly, a low level voltage transmitted through a single p-channel IGFET pass gate is degraded by one transistor threshold voltage, which results in a voltage degradation when storing and restoring a logical "zero" in a FERAM cell. As a result, the memory cell does not operate symmetrically and less charge is extracted from the memory cell during subsequent "read" operations.

One technique for preventing data degradation in a FERAM having a single transistor pass gate is to use a word line booster. In this technique, a word line voltage that is one threshold voltage higher than the supply voltage is applied to the gate terminal of the pass gate transistor. The higher gate voltage prevents the voltage degradation. However, each time the word line is boosted, the memory cell consumes extra power.

Accordingly, it would be advantageous to have an energy efficient, nonvolatile memory cell capable of fully restoring data after a "read"operation. It would be of further advantage for the memory cell to use a single transistor pass gate for high packing density.

DETAILED DESCRIPTION OF THE DRAWINGS

Generally, the present invention provides a data storage element such as, for example, a nonvolatile memory cell and a method for accessing data in the data storage element. In accordance with the present invention, the nonvolatile memory cell comprises a switch and a ferroelectric capacitor. In addition, the nonvolatile memory cell of the present invention is coupled for receiving electrical signals through a word line, a plate line, and a bit line. The use of word lines, plate lines, and bit lines in memory devices is more fully described in "An Experimental 512-bit Nonvolatile Memory with Ferroelectric Storage Cell" by Evans and Womack (*IEEE J. Solid-State Circuits*, vol. 23, no. 5, pp. 1171–1175, October 1988), and which is hereby incorporated herein by reference. In accordance with the present invention, the nonvolatile memory cell fully restores data after a "read" operation without using techniques such as boosting the voltage at the word line. The nonvolatile memory cell of the present invention is energy efficient compared with prior art structures.

Figure 1:
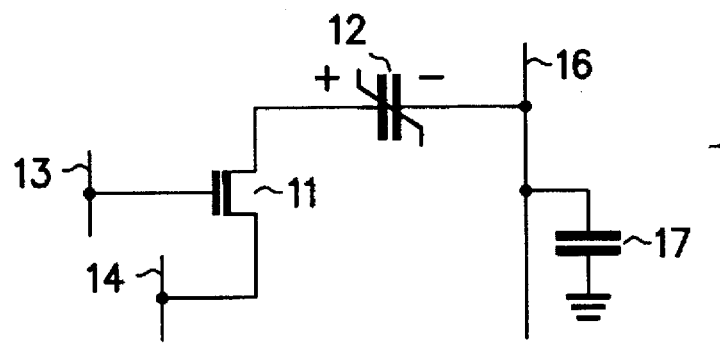
FIG. 1 illustrates a schematic diagram of a memory cell in accordance with an embodiment of the present invention.

FIG. 1 illustrates a schematic diagram of a memory cell 10 configured in accordance with an embodiment of the present invention. Memory cell 10 includes a switch 11, which has a first current conducting terminal coupled to a bit line 16 via a ferroelectric capacitor 12, a second current conducting terminal connected to a plate line 14, and a control terminal connected to a word line 13. By way of example, switch 11 is an n-channel IGFET, wherein the source terminal serves as the first current conducting terminal, the drain terminal serves as the second current conducting terminal, and the gate terminal serves as the control terminal. Although switch 11 is described as an n-channel insulated gate field effect transistor, it should be understood that this is not a limitation of the present invention. For example, switch 11 may be a p-channel insulated gate field effect transistor, a metal semiconductor field effect transistor, a junction field effect transistor, or the like. In addition, switch 11 may include a plurality of transistors such as, for example, a bipolar transistor pair or a CMOS pass gate. FIG. 1 further includes a bit line capacitor 17 connected to a sense amplifier (not shown). Although memory cell 10 of FIG. 1 is illustrated in a one transistor, one capacitor configuration, this is not intended as a limitation of the present invention. In other words, the memory cell may be, for example, in a two transistor, two capacitor configuration, in which one capacitor stores the data and the other capacitor stores the complementary value of the data. Furthermore, a memory device may be comprised of a single memory cell as shown in FIG. 1, or a plurality of memory cells.

In operation, word line 13 transmits control signals, plate line 14 transmits extraction signals, and bit line 16 transmits data to and from memory cell 10. Data is written into memory cell 10 through the steps of: supplying a bit line voltage in accordance with the data value, turning on switch 11, raising and lowering the plate line voltage to place ferroelectric capacitor 12 in a state determined by the data value, and turning off switch 11 to isolate ferroelectric capacitor 12 from plate line 14, resulting in data being stored in ferroelectric capacitor 12. Data is read from memory cell 10 through the steps of: turning on switch 11, raising the plate line voltage to extract polarization charge from ferroelectric capacitor 12 and transmitting it to bit line capacitor 17, and applying a bit line voltage in accordance with the amount of electric charge in bit line capacitor 17, resulting in data being read from memory cell 10. Data is then restored to memory cell 10 by lowering the plate line voltage, thereby placing ferroelectric capacitor 12 in a state determined by the bit line voltage, and turning off switch 11 to isolate ferroelectric capacitor 12 from plate line 14, resulting in the original data being restored in ferroelectric capacitor 12. Writing, reading, and restoring data in memory cells, such as memory cell 10, will be further described infra.

Figure 2:
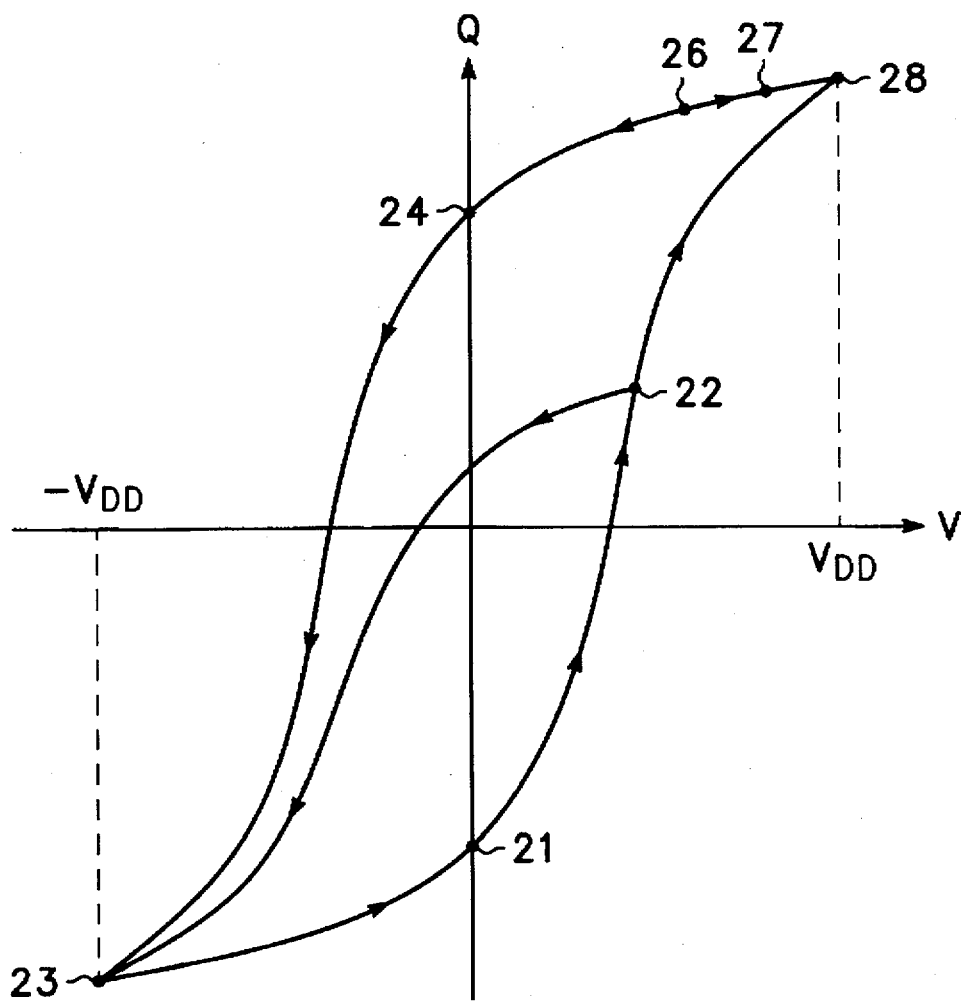
FIG. 2 is a hysteresis loop describing polarization charge as a function of voltage in a ferroelectric capacitor in the merry cell of FIG. 1.

FIG. 2 is a hysteresis loop describing polarization charge (Q) in ferroelectric capacitor 12 as a function of voltage (V) across ferroelectric capacitor 12. It should be noted that when the voltage across ferroelectric capacitor 12 is zero, ferroelectric capacitor 12 can be in either of two polarization states, a logical "one" polarization state 21 or a logical "zero" polarization state 24. When performing a "read" operation, a logical value represented by the polarization state of ferroelectric capacitor 12 in memory cell 10 is retrieved and the original polarization state in ferroelectric capacitor 12 is restored. When performing a "write" operation, ferroelectric capacitor 12 is placed in a polarization state according to the logical value to be written into memory cell 10, regardless of the polarization history of ferroelectric capacitor 12.

Performing a "read" operation when ferroelectric capacitor 12 is initially in logical "one" polarization state 21 can be achieved through the following steps. Before a "read" command is executed, word line 13 and plate line 14 are placed at ground voltage level, i.e., word line 13 and plate line 14 are grounded. Therefore, IGFET 11 is non-conductive and ferroelectric capacitor 12 is isolated from plate line 14. The voltage across the plates of ferroelectric capacitor 12 is zero. The reading process is initiated when word line 13 and plate line 14 are raised to, for example, a supply voltage ($V_{DD}$), wherein IGFET 11 is turned on and ferroelectric capacitor 12 is coupled to plate line 14 through IGFET 11. The electric field in ferroelectric capacitor 12 created by the high plate line voltage is in the opposite direction from its initial polarization field. The electric field depolarizes ferroelectric capacitor 12. Furthermore, the electric field may polarize ferroelectric capacitor 12 in the opposite direction depending on the capacitance ratio of ferroelectric capacitor 12 to bit line capacitor 17. The polarization charge extracted from ferroelectric capacitor 12 charges bit line capacitor 17 and raises the bit line voltage. IGFET 11 becomes non-conductive when the voltage at the source terminal of IGFET 11 reaches one threshold voltage below $V_{DD}$. Ferroelectric capacitor 12 is in an intermediate state 22, as shown in FIG. 2. At this moment, a large amount of electric charge, equal to the difference in the polarization charge between intermediate state 22 and logical "one" polarization state 21, has been extracted from ferroelectric capacitor 12 and placed in bit line capacitor 17, resulting in a high bit line voltage. The sense amplifier which is connected to bit line capacitor 17 is enabled, senses the high bit line voltage, and raises the bit line voltage to $V_{DD}$, resulting in a logical "one" being read from memory cell 10. IGFET 11 becomes conductive by grounding plate line 14. The voltage across ferroelectric capacitor 12 is $-V_{DD}$ and ferroelectric capacitor 12 is in saturation state 23. Ferroelectric capacitor 12 is isolated from plate line 14 by grounding word line 13, i.e., by turning off IGFET 11. Ferroelectric capacitor 12 changes from saturation state 23 to logical "one" polarization state 21, as shown in FIG. 2, because of the leakage from ferroelectric capacitor 12. Therefore, a logical "one" is restored without degradation. If the reading process is initiated before ferroelectric capacitor 12 completes its transition from saturation state 23 to logical "one" polarization state 21, the electric charge in ferroelectric capacitor 12 contributes positive charge to bit line capacitor 17, resulting in an enhanced bit line voltage.

Performing a "read" operation when ferroelectric capacitor 12 is initially in logical "zero" polarization state 24, can be achieved through the following steps. Before a "read" command is executed, word line 13 and plate line 14 are grounded. Therefore, IGFET 11 is non-conductive and ferroelectric capacitor 12 is isolated from plate line 14. The voltage across the plates of ferroelectric capacitor 12 is zero. The reading process is initiated when word line 13 and plate line 14 are raised to, for example, $V_{DD}$, wherein IGFET 11 is turned on and ferroelectric capacitor 12 is coupled to plate line 14 through IGFET 11. The electric field in ferroelectric capacitor 12 created by the high plate line voltage is in the same direction as its initial polarization field. The electric field further polarizes ferroelectric capacitor 12, charges bit line capacitor 17, and raises the bit line voltage. Ferroelectric capacitor 12 moves to an intermediate state 26. At this moment, a small amount of electric charge, equal to the difference in the polarization charge between intermediate state 26 and logical "zero" polarization state 24, has been placed in bit line capacitor 17, resulting in a low bit line voltage. The sense amplifier which is connected to bit line capacitor 17 is enabled, senses the low bit line voltage, and lowers the bit line voltage to ground, resulting in a logical "zero" being read from memory cell 10. IGFET 11 becomes non-conductive when the voltage across ferroelectric capacitor 12 reaches one threshold voltage below $V_{DD}$. Ferroelectric capacitor 12 is in a state 27, as shown in FIG. 2. IGFET 11 becomes conductive by grounding plate line 14. The voltage across ferroelectric capacitor 12 is reduced to zero, and ferroelectric capacitor 12 returns to logical "zero" polarization state 24. Ferroelectric capacitor 12 is isolated from plate line 14 by grounding word line 13, i.e., by turning off IGFET 11. In addition, grounding word line 13 maintains ferroelectric capacitor 12 in logical "zero" polarization state 24. Therefore, a logical "zero" is restored without degradation.

Performing a "write" operation to store a logical "one" into memory cell 10 can be achieved through the following steps. Before a "write" command is executed, word line 13 and plate line 14 are grounded. Therefore, IGFET 11 is nonconductive and ferroelectric capacitor 12 is isolated from plate line 14. The writing process is initiated when bit line 16 is raised to, for example, $V_{DD}$, which represents logical "one". Word line 13 is raised to, for example, $V_{DD}$, resulting in IGFET 11 being turned on and ferroelectric capacitor 12 being coupled to plate line 14 through IGFET 11. The voltage across ferroelectric capacitor 12 is $-V_{DD}$. Ferroelectric capacitor 12 changes to saturation state 23, as shown in FIG. 2, regardless of its initial polarization state. Grounding word line 13 turns off IGFET 11 and isolates ferroelectric capacitor 12 from plate line 14. Ferroelectric capacitor 12 changes from saturation state 23 to logical "one" polarization state 21 because of the leakage from ferroelectric capacitor 12. Therefore, a logical "one" is stored without degradation.

Performing a "write" operation to store a logical "zero" into memory cell 10 can be achieved through the following steps. Before a "write" command is executed, word line 13 and plate line 14 are grounded. Therefore, IGFET 11 is nonconductive and ferroelectric capacitor 12 is isolated from plate line 14. The writing process is initiated when bit line 16 is placed at, for example, ground voltage level, which represents logical "zero". Word line 13 is raised to, for example, one threshold voltage above $V_{DD}$ and plate line 14 is raised to, for example, $V_{DD}$, resulting in IGFET 11 being turned on and ferroelectric capacitor 12 being coupled to plate line 14 through IGFET 11. The voltage across ferroelectric capacitor 12 is $V_{DD}$. Ferroelectric capacitor 12 changes to saturation state 28, as shown in FIG. 2, regardless of its initial polarization state. Grounding plate line 14 results in a zero voltage across ferroelectric capacitor 12. Ferroelectric capacitor 12 changes from saturation state 28 to logical "zero" polarization state 24. Grounding word line 13 turns off IGFET 11 and isolates ferroelectric capacitor 12 from plate line 14. Thus, ferroelectric capacitor 12 remains in logical "zero" polarization state 24 and a logical "zero" is stored without degradation.

By now it should be appreciated that a ferroelectric nonvolatile memory cell and a method for restoring data in the memory cell without using techniques such as word line boosting have been provided. The memory cell uses less area, and therefore has a higher packing density, compared with a CMOS pass gate memory cell. Yet, the word line voltage does not need to be boosted to restore data without degradation. Therefore, an energy efficient alternative to prior art nonvolatile memory cells has been provided.

I claim:

1. A data storage element having a bit line for transmitting data, comprising a switch having a plurality of terminals, a first terminal of the plurality of terminals coupled for receiving control signals, a second terminal of the plurality of terminals coupled for receiving a variable level extraction signal, and a third terminal of the plurality of terminals coupled via a ferroelectric capacitor for transmitting data, wherein the ferroelectric capacitor has a first terminal coupled to the third terminal of the plurality of terminals of the switch and a second terminal directly coupled to the bit line.

2. The data storage element of claim 1, wherein the switch comprises a transistor.

3. The data storage element of claim 1, further comprising a word line coupled to the first terminal of the plurality of terminals of the switch, and a plate line coupled to the second terminal of the plurality of terminals of the switch.

4. A data storage element having a word line, a bit line, and a plate line, comprising:

a switch having a control terminal coupled to the word line, a first current conducting terminal, and a second current conducting terminal coupled to the plate line for receiving a variable level extraction signal; and a capacitor with polarization retention having a first terminal directly coupled to the bit line, and a second terminal coupled to the first current conducting terminal of the switch.

5. The data storage element of claim 4, wherein the switch comprises a field effect transistor.

6. The data storage element of claim 5, wherein the field effect transistor is an n-channel insulated gate field effect transistor.

7. The data storage element of claim 5, wherein the field effect transistor is a p-channel insulated gate field effect transistor.

8. The data storage element of claim 5, wherein the field effect transistor is a metal semiconductor field effect transistor.

9. The data storage element of claim 5, wherein the field effect transistor is a junction field effect transistor.

10. The data storage element of claim 4, wherein the capacitor with polarization retention is a ferroelectric capacitor.

11. A method for restoring data in a data storage element, comprising the steps of:

providing the data storage element having a switch and a capacitor with polarization retention, wherein a control terminal of the switch is coupled for receiving control signals, a first current conducting terminal of the switch is coupled to a first terminal of the capacitor with polarization retention, a second current conducting terminal of the switch is coupled for receiving extraction signals, and a second terminal of the capacitor with polarization retention is directly coupled to a bit line for transmitting data;

providing data in the data storage element;

applying a first control signal to the control terminal of the switch;

applying a first extraction signal to the second current conducting terminal of the switch to read data from the capacitor with polarization retention;

applying a data restoring voltage to the second terminal of the capacitor with polarization retention;

applying a second extraction signal to the second current conducting terminal of the switch; and applying a second control signal to the control terminal of the switch after the second extraction signal is applied to the second current conducting terminal of the switch, resulting in the data being restored in the data storage element.

12. The method for restoring data in a data storage element as claimed in claim 11, wherein the step of providing the data storage element further includes providing a word line coupled to the control terminal of the switch, and a plate line coupled to the second current conducting terminal of the switch.

13. The method for restoring data in a data storage element as claimed in claim 11, wherein the step of applying a data restoring voltage includes applying a voltage determined by the data read from the capacitor with polarization retention.

14. The method for restoring data in a data storage element as claimed in claim 11, wherein the step of providing data in the data storage element comprises the steps of:

applying a data storing voltage to the first current conducting terminal of the switch via the capacitor with polarization retention;

turning on the switch;

applying the first extraction signal to the second current conducting terminal of the switch;

applying the second extraction signal to the second current conducting terminal of the switch; and turning off the switch, resulting in data being stored in the data storage element.

15. The method for restoring data in a data storage element as claimed in claim 14, wherein the step of applying a data storing voltage includes applying a voltage determined by the data to be provided in the data storage element.

16. The method for restoring data in a data storage element as claimed in claim 14, wherein the step of turning on the switch includes applying a third control signal to the control terminal of the switch.

17. The method for restoring data in a data storage element as claimed in claim 14, wherein the step of turning off the switch includes applying the second control signal to the control terminal of the switch.

* * * * *